(12) United States Patent
Hoentschel et al.

(10) Patent No.: US 9,735,174 B2
(45) Date of Patent: Aug. 15, 2017

(54) FDSOI—CAPACITOR

(71) Applicant: GLOBALFOUNDRIES Inc., Grand Cayman (KY)

(72) Inventors: Jan Hoentschel, Dresden (DE); Peter Baars, Dresden (DE); Hans-Peter Moll, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 116 days.

(21) Appl. No.: 14/596,331

(22) Filed: Jan. 14, 2015

(65) Prior Publication Data
US 2016/0204129 A1 Jul. 14, 2016

(51) Int. Cl.
*H01L 21/762* (2006.01)
*H01L 27/12* (2006.01)
*H01L 21/265* (2006.01)
*H01L 21/285* (2006.01)
*H01L 21/84* (2006.01)
*H01L 27/108* (2006.01)
(Continued)

(52) U.S. Cl.
CPC .... *H01L 27/1207* (2013.01); *H01L 21/26513* (2013.01); *H01L 21/28518* (2013.01); *H01L 21/76264* (2013.01); *H01L 21/84* (2013.01); *H01L 27/0629* (2013.01); *H01L 27/1087* (2013.01); *H01L 27/10829* (2013.01); *H01L 28/60* (2013.01); *H01L 29/0649* (2013.01); *H01L 29/786* (2013.01); *H01L 29/94* (2013.01); *H01L 27/1085* (2013.01)

(58) Field of Classification Search
CPC ........................ H01L 21/7624; H01L 27/1207

USPC ............................................ 257/350; 438/155
See application file for complete search history.

(56) References Cited

U.S. PATENT DOCUMENTS 7,851,861 B2 * 12/2010 Tu ........................... H01G 4/002
257/350
7,888,746 B2   2/2011 Tischler
(Continued)

FOREIGN PATENT DOCUMENTS

TW         200834817 A       8/2008

OTHER PUBLICATIONS

Taiwanese Examination Report dated Jan. 5, 2017 for Taiwan patent application No. 104137136.

*Primary Examiner* — Mark Prenty
(74) *Attorney, Agent, or Firm* — Amerson Law Firm, PLLC

(57) ABSTRACT

A method of manufacturing a semiconductor device including a capacitor structure is provided, including the steps of providing an SOI wafer comprising a substrate, a buried oxide (BOX) layer formed over the substrate and a semiconductor layer formed over the BOX layer, removing the semiconductor layer in a first region of the wafer to expose the BOX layer, forming a dielectric layer over the exposed BOX layer in the first region, and forming a conductive layer over the dielectric layer. Moreover, a semiconductor device including a capacitor formed on a wafer is provided, wherein the capacitor comprises a first capacitor electrode comprising a doped semiconductor substrate of the wafer, a capacitor insulator comprising an ultra-thin BOX layer of the wafer and a high-k dielectric layer formed on the ultra-thin BOX layer, and a second capacitor electrode comprising a conductive layer formed over the high-k dielectric layer.

21 Claims, 4 Drawing Sheets

(51) Int. Cl.
*H01L 49/02* (2006.01)
*H01L 29/06* (2006.01)
*H01L 29/786* (2006.01)
*H01L 27/06* (2006.01)
*H01L 29/94* (2006.01)

(56) References Cited

U.S. PATENT DOCUMENTS

| | | | |
|---|---|---|---|
| 8,748,258 B2 * | 6/2014 | Cheng | H01L 29/66181 257/310 |
| 9,202,761 B2 * | 12/2015 | Makiyama | H01L 21/84 |
| 2013/0087855 A1 | 4/2013 | Makiyama et al. | |
| 2015/0364534 A1 * | 12/2015 | Nowak | H01L 28/40 257/300 |

* cited by examiner

FDSOI—CAPACITOR

BACKGROUND OF THE INVENTION

1. Field of the Invention

Generally, the present disclosure relates to the field of integrated circuits, and, in particular, to capacitors within the Fully Depleted Silicon-on-Insulator manufacturing technology.

2. Description of the Related Art

Integrated circuits typically include a large number of circuit elements, which form an electric circuit. In addition to active devices such as, for example, field effect transistors and/or bipolar transistors, integrated circuits can include passive devices, such as resistors, inductors and/or capacitors.

As integration density of semiconductor devices increases, the area occupied by individual devices continues to shrink. Notwithstanding this, a capacitor for storing data of, for instance, a dynamic random access memory (DRAM) is required to have a sufficient capacitance, irrespective of the decrease in the area occupied by the capacitor. In addition to so-called native capacitors, which make use of the native or "parasitic" inter-metal capacity between metal lines in integrated circuits, there are metal-insulator-metal (MIM) capacitors. Accordingly, a metal-insulator-metal (MIM) capacitor, in which a lower electrode and an upper electrode are formed of metal and separated by a layer of insulating material, is being used in many integrated circuit products. Metal-insulator-metal capacitors can be used in CMOS, BICMOS and bipolar integrated circuits. Typical applications of metal-insulator-metal capacitors include filter and analog capacitors, for example, in analog-to-digital converters or digital-to-analog converters, decoupling capacitors, radio frequency coupling and radio frequency bypass capacitors in radio frequency oscillators, resonator circuits, and matching networks.

Capacitors of the art suffer from the following problems. Vertical natural capacitors and finger metal-oxide-metal capacitors show insufficient capacitance due to low values of the dielectric constants of the used ultra-low-k dielectrics that, in principle, require large areas to provide significant capacitance anyway. The voltage of lateral capacitors, on the other hand, is limited, in principle, by the operation reliability of the employed ultra-low-k dielectrics. Moreover, conventional MIM capacitors in metallization/wire layers demand complex integration schemes.

A plurality of passive capacitors are typically formed in integrated circuits that are used for a plurality of purposes, such as for decoupling. Decoupling in integrated circuits is an important aspect for reducing the switching noise of the fast switching transistors, since the decoupling capacitor may provide energy at a specific point of the circuitry, for instance at the location of a fast switching transistor, and thus reduce voltage variations which may otherwise unduly affect the logic state represented by the transistor. Since these capacitors are usually formed in and on active semiconductor regions, significant die area is consumed by the decoupling capacitors. Typically, these capacitors are formed in a planar configuration over active semiconductor regions, which act as a first capacitor electrode. The capacitor dielectric is formed during the process of manufacturing gate insulation layers of field effect transistors, wherein the gate material is usually patterned along with gate electrode structures so as to serve as the second capacitor electrode. Thus, in addition to the significant consumption of die area, increased leakage currents may be encountered in devices requiring highly capacitive decoupling elements, thereby significantly contributing to the total static leakage consumption and, therefore, to the total power consumption of the integrated circuit. For sophisticated applications, in terms of power consumption and/or heat management, the high amount of static power consumption may not be acceptable, and, therefore, usually a so-called dual gate oxide processing may be used to increase the thickness of the dielectric layer of the capacitors, thereby reducing the leakage current of these elements.

With reference to FIGS. 1a-1c, a typical prior art process flow for forming a semiconductor device comprising a highly capacitive decoupling capacitor having a moderate leakage current will now be described. FIG. 1a schematically shows a cross-sectional view of a semiconductor device 100 at a specific manufacturing stage. The semiconductor device 100 comprises a substrate 101, for example a silicon substrate, including a first semiconductor region 130 for receiving a transistor element and a second semiconductor region 120 for receiving a decoupling capacitor of high capacitance. Thus, the semiconductor region 120 may, contrary to the semiconductor region 130, occupy a significant fraction of a functional block of the device 100. The first and second semiconductor regions 130, 120 are enclosed by respective isolation structures 102. The first semiconductor region 130 and, partially, the corresponding isolation structure 102, are covered by a mask layer 103 that may be comprised of photoresist. The second semiconductor region 120 comprises a surface portion 104 having severe lattice damage caused by an ion implantation, as indicated by 105.

A typical process flow for forming the semiconductor device as depicted in FIG. 1a includes sophisticated photolithography and etch techniques for defining the isolation structures 102, followed by a further photolithography step to pattern the resist mask 103. Subsequently, the ion implantation 105 is carried out with any appropriate ions, such as silicon, argon, xenon and the like, wherein a dose and energy are selected to create severe lattice damage in the portion 104, thereby significantly changing the diffusion behavior of the portion 104 during an oxidation process that is to be carried out subsequently.

FIG. 1b schematically shows the semiconductor structure 100 in an advanced manufacturing stage. A first dielectric layer 131, substantially comprised of silicon dioxide and having a first thickness 132, is formed on the first semiconductor region 130. A second dielectric layer 121, having a second thickness 122 and comprised of the same material as the first dielectric layer 131, is formed on the second semiconductor region 120. The first and the second dielectric layers 131 and 121 are formed by conventional oxidation in a high temperature furnace process or by a rapid thermal oxidation process. Due to the severe lattice damage of the surface portion 104, the oxygen diffusion in this surface portion 104 is significantly enhanced compared to silicon portions having a substantially undisturbed crystallinity, such as in the surface region of the first semiconductor region 130. Consequently, oxide growth in and on the second semiconductor region 120 is increased compared to the growth rate of the first semiconductor region 130 so that the first thickness 132 differs from the second thickness 122 by approximately 0.2-1.0 nm for a thickness of the first dielectric layer 131 on the order of 1-5 nm.

FIG. 1c schematically shows the semiconductor device 100 in a further advanced manufacturing stage, wherein a decoupling capacitor 140 is formed in and on the second semiconductor region 120, and a field effect transistor 150 is formed in and on the first semiconductor region 130. The transistor element 150 comprises a gate electrode 133 including, for example, highly doped polysilicon and a metal suicide portion 135. Moreover, sidewall spacers 134 are formed adjacent to sidewalls of the gate electrode 133. Source and drain regions 136, each including a metal silicide portion 135, are formed in the first semiconductor region 130. The capacitor 140 comprises a conductive electrode 123 comprised of the same material as the gate electrode 133 and formed over the second dielectric layer 121. The electrode 123 represents a first electrode of the capacitor 140. The capacitor electrode 123 includes a metal silicide portion 125 and is enclosed by sidewall spacer elements 124.

A typical process flow for forming the transistor element 150 and the capacitor 140 may include the following steps. A polysilicon layer may be deposited over the device as shown in FIG. 1b and may be patterned by well-known photolithography and etching techniques to create the capacitor electrode 123 and die gate electrode 133 in a common process. Subsequently, the drain and source regions 136 are formed by ion implantation, wherein intermittently the sidewall spacers 134 and the sidewall spacers 124 are formed so that the sidewall spacers 134 may act as implantation masks to appropriately shape the dopant concentration of the drain and source regions 136. Thereafter, the metal silicide portions 125 and 135 may be formed by depositing a refractory metal and initiating a chemical reaction between the metal and the underlying polysilicon of the capacitor electrode 123, the gate electrode 133 and the silicon in the drain and source regions 136.

As is evident from FIG. 1c, the capacitor 140 having the second dielectric layer 121 with the increased thickness 122 will exhibit a reduced leakage current rate compared to the corresponding leakage rate caused by the relatively thin first dielectric layer 131 having the second thickness 132 that is optimized to provide the required dynamic performance of the transistor 150. Although a remarkably improved leakage rate of the capacitor 140 may be obtained with the above-described conventional approach, one decisive drawback is the significantly reduced capacitance per unit area of the capacitor 140 owing to the increased thickness of the second dielectric layer 121. Thus, for a given desired charge storage capacity as required for an enhanced decoupling effect, an even more enlarged area is necessary for the capacitor 140. A further disadvantage of the conventional prior art approach is the requirement of a high temperature oxidation process for forming the first and second dielectric layers 131 and 121 so that this process scheme may not be compatible with alternative solutions for forming extremely thin gate dielectrics, such as advanced deposition methods for forming ultra-thin gate insulation layers. Moreover, the process flow described above leads to a highly non-uniform pattern density, i.e., regions with increased dimensions representing, for instance, the capacitor 140, are located in the vicinity of tiny regions such as the transistor 150, which may compromise the patterning process for forming the highly critical gate electrodes, such as the gate electrode 133. In view of the above-described situation, there is a need for an improved technique that enables the formation of capacitors, while avoiding, or at least reducing the effects of, one or more of the problems identified above.

Accordingly, there is a need for enhanced capacitor structures and formation processes, for example, for use in semiconductor device fabrication, which integrate well with SOI manufacturing techniques, in particular, Fully Depleted SOI (FDSOI) manufacturing techniques. The present disclosure provides enhanced capacitor structures and manufacturing processes for the same wherein the above-mentioned issues can properly be addressed and the mentioned problems of the art can be overcome or at least alleviated.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method of manufacturing a semiconductor device comprising a capacitor structure disclosed herein includes the steps of providing an SOI wafer comprising a substrate, a buried oxide (BOX) layer formed over (for example, on) the substrate and a semiconductor layer formed over (for example, on) the BOX layer, removing the semiconductor layer in a first region of the wafer to expose the BOX layer, forming a dielectric layer over (for example, on) the exposed BOX layer in the first region and forming a conductive layer (herein, by the term "conductive" it is always meant "electrically conductive") over the dielectric layer. The conductive layer represents an electrode of the capacitor to be built and the combined dielectric layer and BOX layer represent the capacitor insulator. Here and in the following, the semiconductor layer may comprise polysilicon or amorphous silicon and may have a thickness of below 30 nm or below 20 nm, the dielectric layer may be a high-k dielectric layer with a thickness of below 20 nm or below 10 nm, dielectric constant k higher than 5 or 10 or 20, the BOX layer may be an ultra-thin BOX (UTBOX) layer with a thickness of below 30 nm or below 20 nm, and/or the wafer may be a fully depleted SOI (FDSOI) wafer. The method can be fully integrated in the manufacturing process of FDSOI transistor devices wherein the conductive layer is used to form gate electrodes and the dielectric layer is used to form gate dielectrics of TFTs at wafer regions different from the one where the capacitor structure is formed. In other words, in the context of integrated TFT and capacitor production, a conductive layer may be formed (and patterned) over the wafer and may provide both capacitor electrodes for capacitor devices and gate electrodes for TFTs. Similarly, a dielectric layer may be formed (and patterned) over the wafer and may provide both capacitor insulators (together with the BOX layer) for capacitor devices and gate dielectrics for TFTs.

The method may be supplemented by the steps of defining the first region and a second region of the wafer by forming an isolator structure, in particular, a shallow trench insulator, and further comprising removing the semiconductor layer and the BOX layer in a first portion of the second region adjacent to the isolator structure while maintaining the semiconductor layer and the BOX layer in a second portion of the second region adjacent to the first portion. The first portion of the second region represents an area of the wafer where semiconductor structures may be formed that do not require an SOI design.

Moreover, a method of forming a semiconductor device on an SOI (silicon-on-isolator) wafer with a substrate, a buried oxide (BOX) layer formed over (for example, on) the substrate and a semiconductor layer formed over (for example, on) the BOX layer is provided, wherein the semiconductor device comprises a capacitor and a transistor device, including the steps of removing the semiconductor layer in a first region of the wafer where the capacitor is to be formed to expose the BOX layer, forming a dielectric layer, in particular, a high-k dielectric layer, over (for example, on) the exposed BOX layer and in a second region of the wafer where the transistor device is to be formed, and forming a conductive layer (for example, comprising polysilicon or amorphous silicon) over the dielectric layer. In this method, the conductive layer represents a capacitor electrode of the capacitor and at least a part of a gate electrode of the transistor device and the dielectric layer and the BOX layer represent a capacitor insulator of the capacitor and the dielectric layer represents at least a part of a gate dielectric of the transistor device. In other words, forming a capacitor electrode of the transistor device and forming the capacitor electrode comprise the step of forming the conductive layer over the wafer. Similarly, forming the gate dielectric of the transistor device and forming the capacitor insulator comprises forming the dielectric layer. The method may further include forming a non-SOI region where both the BOX layer and the semiconductor layer are removed before the formation of the dielectric layer and the conductive layer.

Moreover, a semiconductor device is provided including a capacitor formed on a wafer, wherein the capacitor comprises a first capacitor electrode comprising a doped semiconductor substrate of the wafer, a capacitor insulator comprising an ultra-thin buried oxide layer of the wafer (for example, with a thickness of less than 30 nm) and a high-k dielectric layer (for example, with k>5 and a thickness of below 20 or below 10 nm) formed on the ultra-thin buried oxide layer and a second capacitor electrode comprising a conductive layer formed over the high-k dielectric layer.

BRIEF DESCRIPTION OF THE DRAWINGS

The disclosure may be understood by reference to the following description taken in conjunction with the accompanying drawings, in which like reference numerals identify like elements, and in which.

Figure 1A:
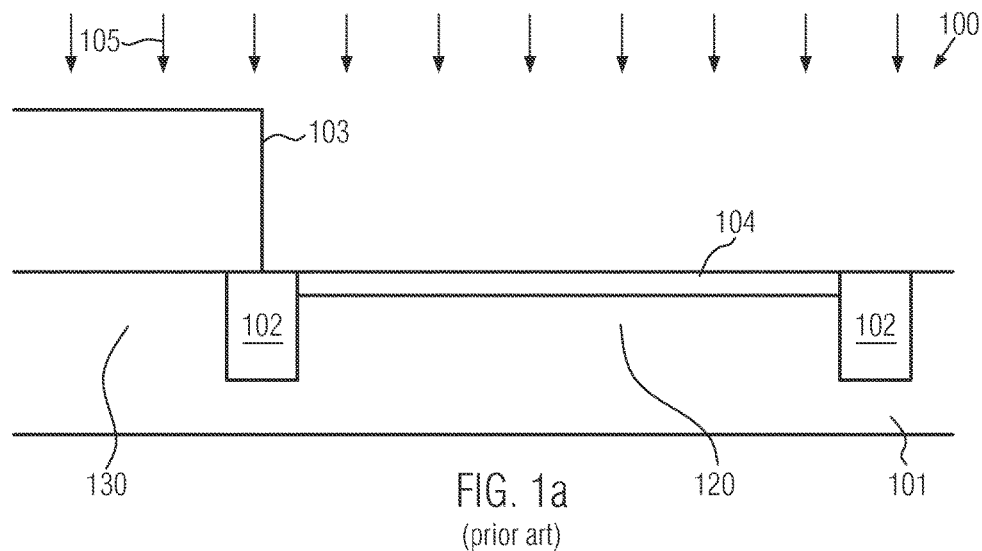
FIGS. 1a-1c show schematic cross-sectional views of a semiconductor device in particular stages of a manufacturing method according to an example known in the art.
Figure 1B:
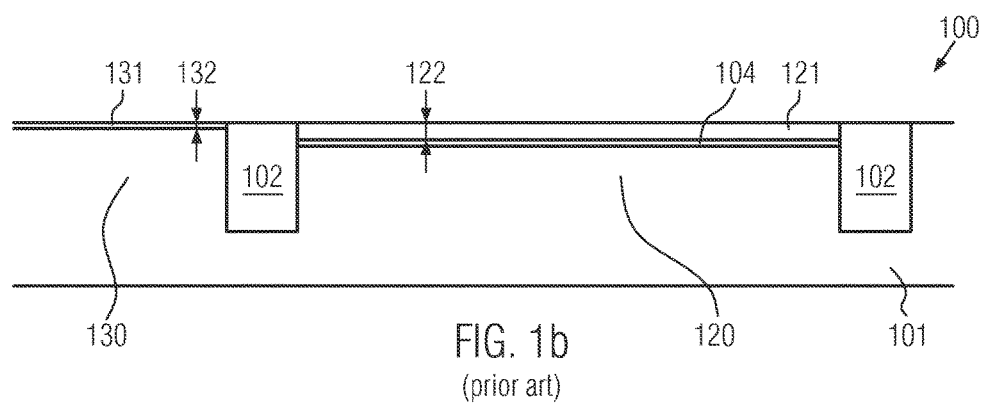
Figure 1C:
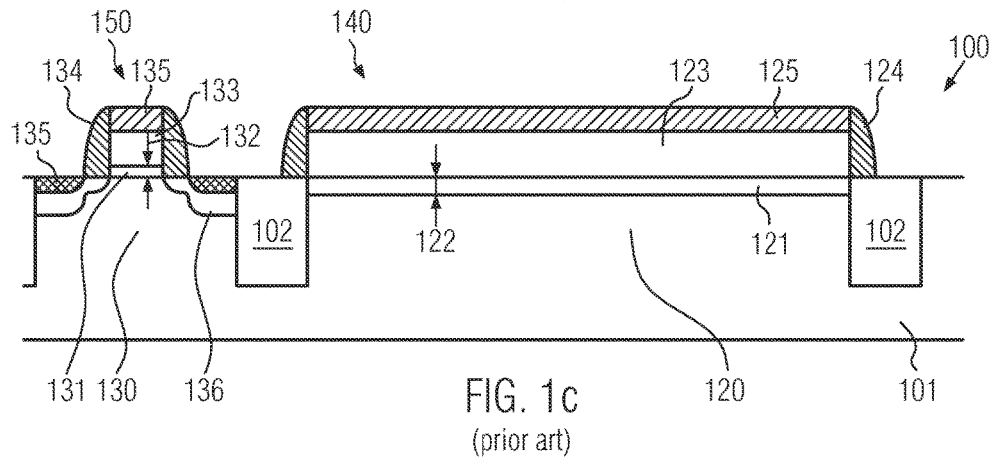

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides methods for forming a capacitor, in particular, a decoupling capacitor in an SOI semiconductor structure, in particular, an FDSOI structure. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, etc., in principle. The techniques and technologies described herein can be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate. It should be stressed that, according to the method of manufacturing a semiconductor device that is described herein, the formation of a capacitor, in particular, a decoupling capacitor, can be integrated within the process flow of manufacturing a plurality of transistor devices (FDSOI TFTs). Exemplary embodiments will now be described with reference to the drawings.

Figure 2A:
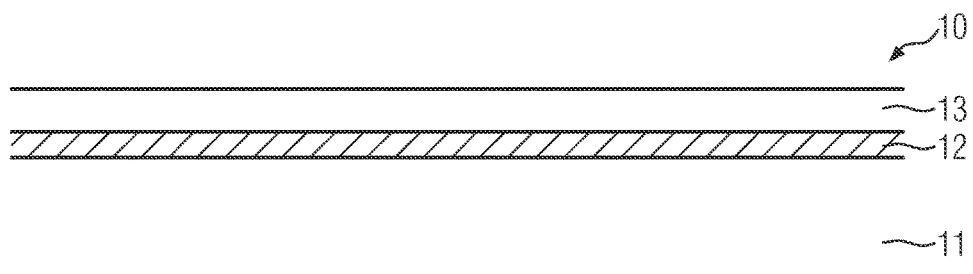
FIGS. 2a-2h show schematic cross-sectional views of a semiconductor structure in particular stages of a manufacturing method according to an example of the present disclosure.

At an exemplary initial state of the manufacturing of a semiconductor device 10 as shown in FIG. 2a, an SOI wafer comprising a semiconductor substrate 11, a buried oxide (BOX) layer 12 formed on the semiconductor substrate 11 and a semiconductor layer 13 formed on the BOX layer 12 is provided. The semiconductor substrate 11 may be a silicon substrate, in particular, a single crystal silicon substrate. Other materials may be used to form the semiconductor substrate 11 such as, for example, germanium, silicon germanium, gallium phosphate, gallium arsenide, etc. The BOX layer 12 may be an ultra-thin BOX (UTBOX) layer with a thickness of below 30 nm or below 20 nm, for example. The BOX layer 12 may comprise or be made of silicon oxide.

The semiconductor layer 13 may be comprised of any appropriate semiconductor material, such as silicon, silicon/germanium, silicon/carbon, other II-VI or III-V semiconductor compounds and the like. The semiconductor layer 13 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. In particular, the wafer shown in FIG. 2a may be a Fully Depleted SOI (FDSOI) wafer, i.e., materials and thicknesses of the layers are chosen to be appropriate for the formation of fully depleted SOI semiconductor devices, in particular, FDSOI TFTs.

Figure 2B:
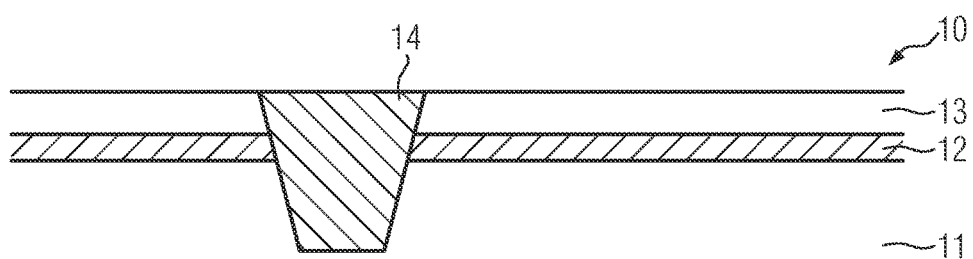

As shown in FIG. 2b, a shallow trench isolation (STI) 14 is formed by standard techniques known in the art comprising etching the SOI wafer and filling the etched portion with some insulating material, for example, with some oxide material. The STI 14 separates different areas (a first and a second region) of the wafer from each other, on which different kinds of devices can be formed. Care has to be taken to maintain the thin semiconductor layer 12 (for example, with a thickness of below 30 nm or below 20 nm) during the process of the formation of the STI 14. In principle, dual STI schemes may be applied to provide different depths of STIs that might be suitable for back biasing of FDSOI devices that might be formed in later manufacturing steps and allow for simultaneous multiple back biasing.

Figure 2C:
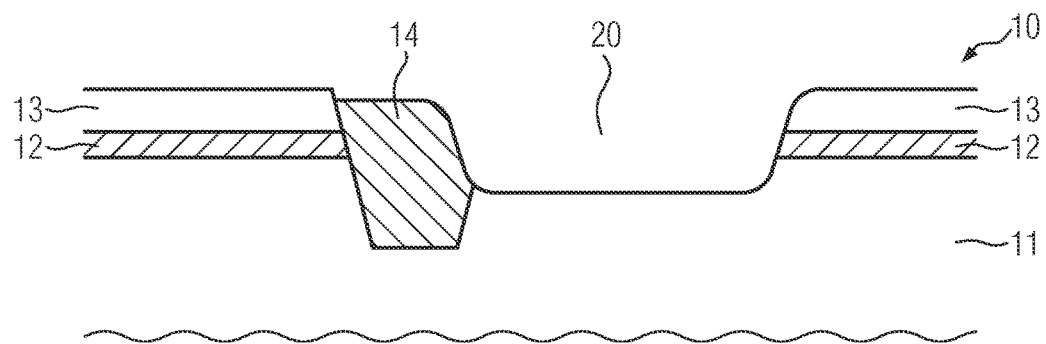

An etching process may be performed in order to form a non-SOI region 20 (a first portion of the second region of the wafer), as shown in FIG. 2c. The non-SOI region 20 may be formed by depositing and patterning a hard mask, for example comprising SiN, and reactive ion etching (RIE). Both the semiconductor layer 13 and the BOX layer 12 are removed in the non-SOI region 20. In the non-SOI region 20, devices that are not formed on (FD)SOI basis may be formed. Depending on the design rule, such devices may be formed overlapping the STI 14 partially. As illustrated in FIG. 2c, the non-SOI region 20 extends from the STI area 14 to a (FD)SOI region (second portion of the second region; shown on the right-hand side of FIG. 2c). Alternatively, according to the design requirements, the non-SOI region 20 may be fully localized within standard (FD)SOI regions without extending into an STI area.

Figure 2D:
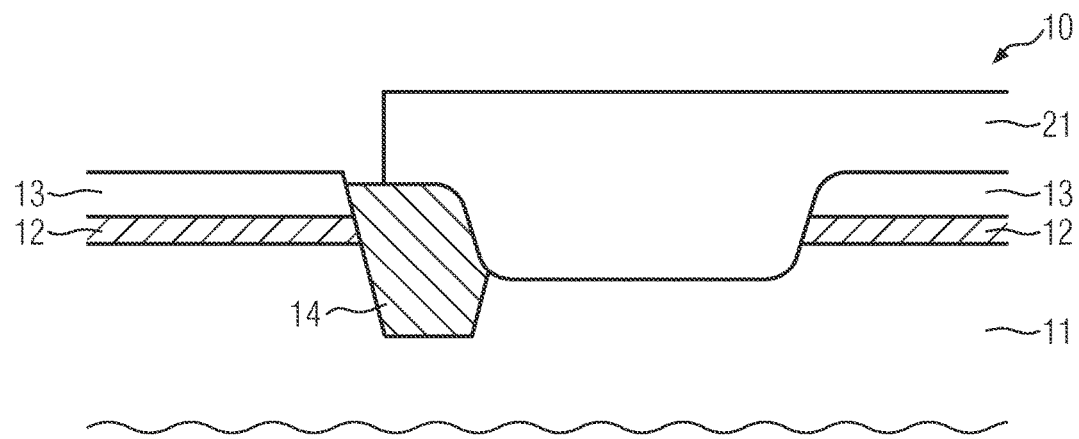
Figure 2E:
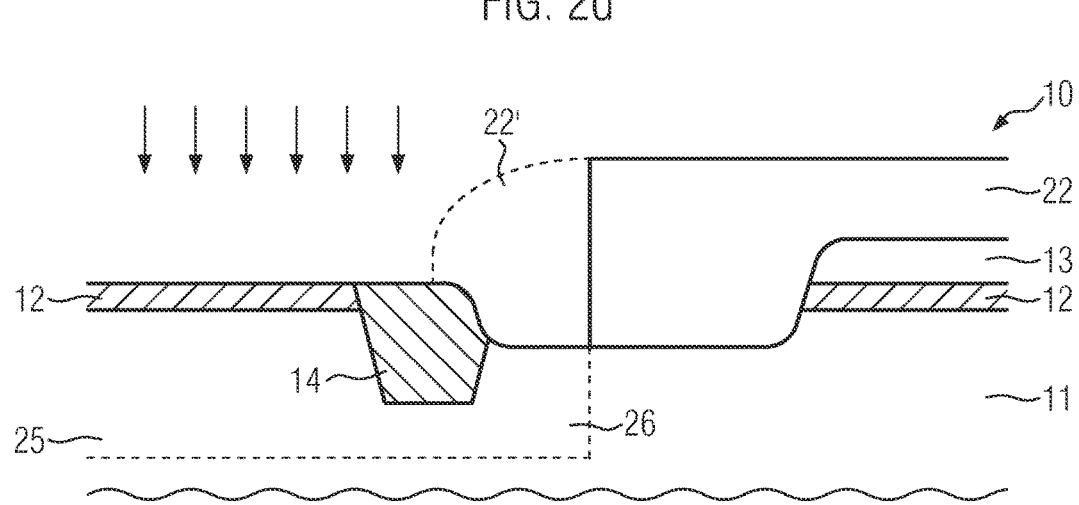

As shown in FIG. 2d, a hard mask 21, for example an SiN hard mask, is formed on the STI 14, the non-SOI region 20 and the FDSOI region on the right-hand side of the semiconductor device 10. After formation of the SiN mask 21 (for example, by depositing an SiN layer and patterning the same by means of a photoresist mask formed over the SiN layer), the semiconductor layer 13 exposed by the mask layer 21 is removed in the region shown on the left side of the STI 14 (see FIG. 2e). The process of removing (for example, etching) the semiconductor layer 13 must be sensitive to the underlying UTBOX layer 12 without leaving residuals of the semiconductor layer 13 (for example, residuals comprising silicon). As also shown in FIG. 2e, a well implantation step is performed after the deposition of one or more implantation masks (resists) 22, 22' (the arrows illustrate the doping process). For example, an implantation with P- or N-dopants may be performed through the exposed UTBOX layer 12 in order to adjust the electrical properties of the finally resulting decoupling capacitor in the implantation region 25. During the formation of the implantation region 25 (see FIG. 2f), the mask 22 may cover the STI 14. After reduction of the area of the mask 22, thereby exposing the STI 14, an isolation well implantation region 26 may be formed as it is appropriate within the process flow of manufacturing CMOS devices. Alternatively, forming the well implantation region 25 of the capacitance and the well isolation implantation region 26 may be performed simultaneously within the same processing step.

In the following description, formation of a decoupling capacitor within a high-k metal gate (HKMG) first process flow will be described. Alternatively, formation of the decoupling capacitor may be formed within an HKMG last (replacement gate) process flow. In fact, there are basically these two well-known processing methods for forming a planar or 3D transistor with an HKMG structure. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HKMG gate structure for the device is formed. Using the "gate first" technique, on the other hand, involves forming a stack of layers of material across the substrate, wherein the stack of materials includes a high-k gate insulation layer, one or more metal layers, a layer of polysilicon and a protective cap layer, for example, silicon nitride. One or more etching processes are performed to pattern the stack of materials to thereby define the basic gate structures for the transistor devices.

Figure 2F:
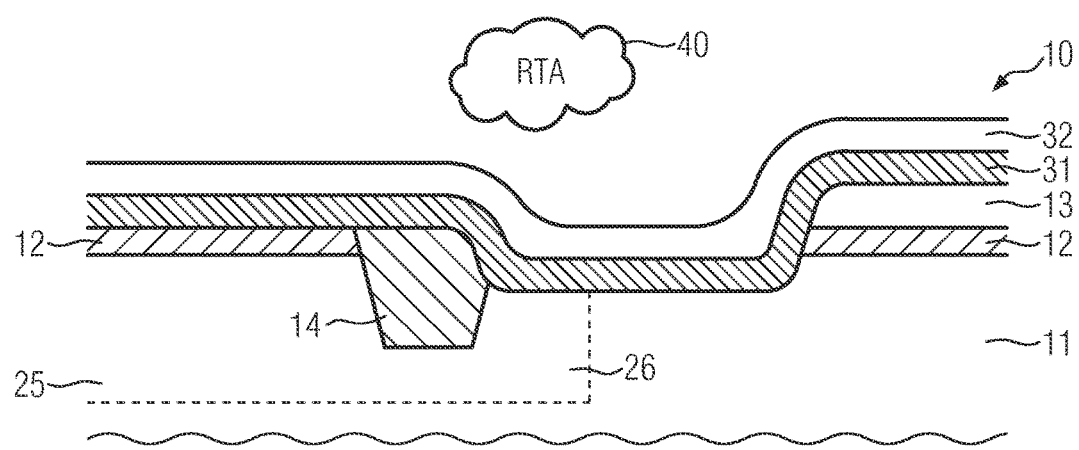

After removal of the implantation mask 22, 22', gate stack formation is performed. As shown in FIG. 2f, a high-k dielectric layer 31 is formed over the entire structure comprising the (FD)SOI regions, the STI 14 and the non-SOI region 20. Over or on the high-k gate dielectric layer 31, a conductive layer 32 is formed. In the present example, the formation of a capacitor is integrated in the manufacturing process of FETs. The conductive layer 32 is formed over the wafer and, in regions of the wafer where transistor devices are formed, the conductive layer 32 represents a gate electrode layer. For this reason, in the following description, the conductive layer 32 is often referred to as a gate electrode layer. Similarly, due to its function in TFT devices to be formed in regions different from the region where the capacitor is formed, the high-k dielectric layer 31 may be referred to as a high-k gate dielectric layer. The high-k gate dielectric layer 31 may represent a sophisticated gate dielectric material including a high-k dielectric material, possibly in combination with a "conventional" dielectric material, such as a silicon dioxide-based material, for instance in the form of a silicon, oxygen, nitrogen-containing compound and the like. The dielectric layer may have a thickness of below 20 or 10 nm, for example, approximately 5 or 1 nm, and may have any appropriate composition in order to provide desired interface characteristics with respect to the underlying regions. For instance, the high-k dielectric layer 31 may be provided in the form of a hafnium-based material, such as hafnium oxide, hafnium silicon oxide. Materials such as tantalum oxide ($Ta_2O_5$) with a k of approximately 25, strontium titanium oxide ($SrTiO_3$) having a k of approximately 150, hafnium oxide ($HfO_2$), HfSiO, zirconium oxide ($ZrO_2$), and the like may be used for forming the high-k dielectric layer 31. At least at the interface to the underlying UTBOX layer on the left-hand side of the STI 14, the high-k dielectric layer 31 may comprise an SiON material for enhancing the adhesion.

The conductive layer (gate electrode layer) 32 may comprise a metal-containing electrode material or cap material, which have a desired degree of conductivity. Furthermore, the metal-containing material may provide an appropriate work function for one type of transistor still to be formed, for instance for a transistor to be formed in and above active regions not shown in the figures. For example, titanium nitride, aluminum or lanthanum may represent an appropriate material providing the desired electronic characteristics. Moreover, an intermediate liner material may be comprised in the gate electrode layer 32. The intermediate liner material may represent a silicon dioxide material, while, in other cases, other materials may be used that may provide the desired etch stop capabilities in a very advanced manufacturing stage, as will be explained later on. For instance, the liner material may be provided in the form of a silicon oxynitride material, a silicon nitride material and the like. Furthermore, the gate electrode layer 32 may comprise polysilicon or amorphous silicon, in particular, formed on a metal-containing material as described above.

After formation of the high-k gate dielectric layer 31 and the gate electrode layer 32, a (two-step) rapid thermal anneal (RTA) process 40 may be performed in order to adjust charges and dipoles in the high-k material and the work function of a work function adjusting material of the gate stack.

Figure 2G:
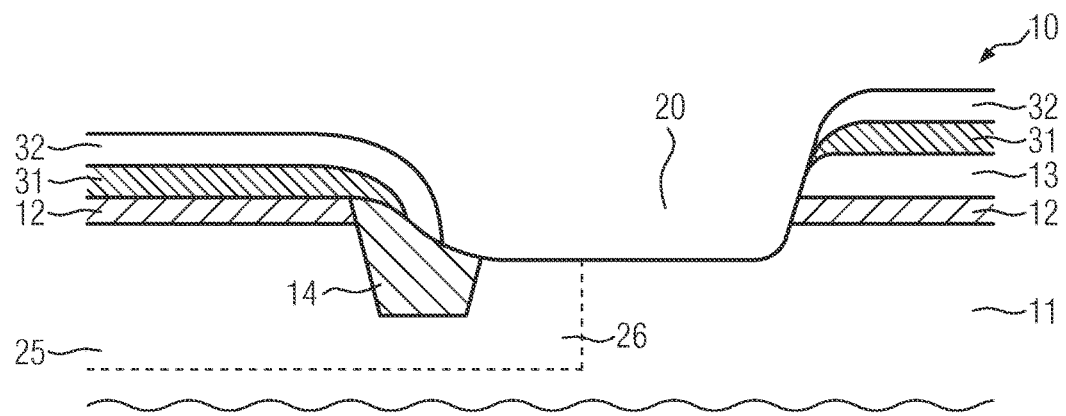

FIG. 2g shows the semiconductor device 10 after the process of etching of the gates. In particular, the gate stack (high-k gate dielectric layer 31 and gate electrode layer 32) is removed from the non-SOI region 20 and, within one single etching process, the standard gates for all devices, in particular, all FETs, to be formed on the wafer may be formed. It goes without saying that further implantation steps to form source/drain regions for FET devices have to be performed and that no source/drain regions have to be formed for the decoupling capacitor under consideration. Note that the edges of the gate stack of the capacitor left of the STI 14 land on the STI 14 in order not to be electrically contacted to the isolation well implant region 26. This can be achieved by properly chosen design rules for an etching mask used for the gate stack etching process.

Figure 2H:
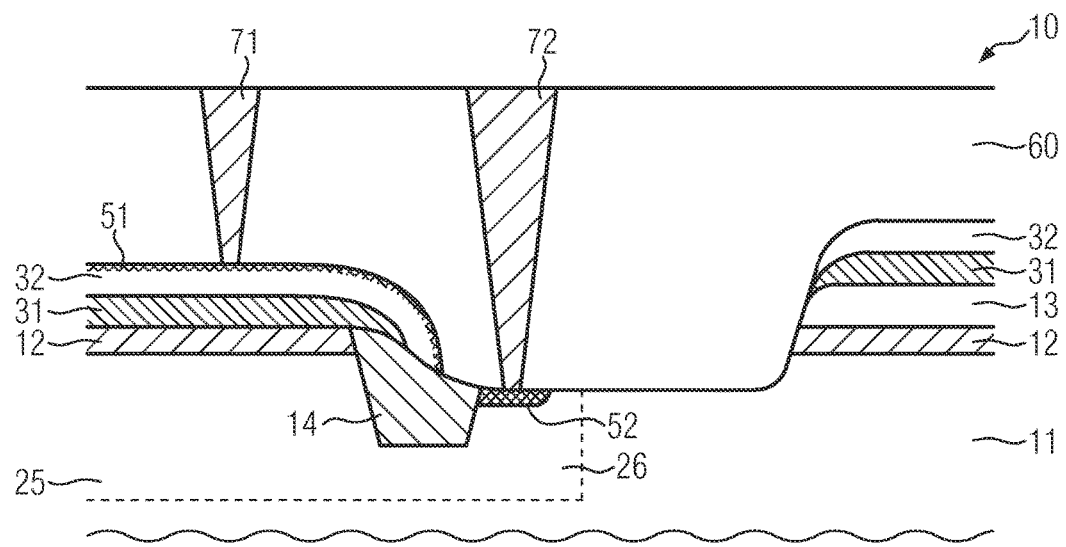

The finally built capacitor is shown in FIG. 2h. A silicidation process may be formed to obtain regions 51 and 52 of low electrical resistance. The silicide regions 51 and 52 may comprise nickel silicide, nickel/platinum silicide or cobalt silicide and the like. A planarization step may be performed and an interlayer dielectric layer 60 is formed over the entire structure. The ILD 60 may include a deposited silicon oxide, silicon nitride, or silicon oxynitride, or another material suitable for providing electrical isolation between semiconductor devices. ILD layer 60 may be blanket-deposited using, for example, plasma enhanced chemical vapor deposition (PECVD), a low pressure chemical vapor deposition (LPCVD), or a CVD process. In one example, the ILD 60 includes a silicon oxide material and has a thickness of about 50 nm to about 1 micron, for example, a thickness of about 100 nm to about 500 nm. In particular, the ILD 60 may consist of or comprise an ultra-low-k (ULK) material with k<2.8 or k of at most 2.4.

A planarization process, for example, a chemical mechanical polishing process, may be performed after the deposition of the dielectric layer 60 for obtaining a substantially planar surface. In the chemical mechanical polishing process, the surface of the semiconductor structure 10 is moved relative to a polishing pad while a slurry is supplied to an interface between the surface of the semiconductor structure 10 and the polishing pad. The slurry can react chemically with portions of the semiconductor structure 10 at the surface, and reaction products can be removed by friction between the semiconductor structure 10 and the polishing pad and/or by abrasion caused by abrasive particles in the slurry.

Electric contacting to both the silicidated regions 51 of the gate electrode layer 32, for example, the silicided polysilicon or amorphous silicon material, may be achieved by forming vias in the ILD 60 and filling the same with some contact material, for example, aluminum or copper, as shown in FIG. 2h.

The finally built capacitor comprises a first capacitor electrode in the form of the gate electrode layer 32 shown on the left-hand-side of FIG. 2h and a second capacitor electrode in the form of the doped regions 25 and 26 of the substrate 11. The capacitor insulator is formed by both the high-k gate dielectric 31 and the UTBOX layer 12. The final capacitance may be adjusted by the overall area covered by the capacitor structure as well as the doping levels involved. The capacitor electrodes are contacted by contacts 71 and 72 formed in the ILD layer 60.

As a result, a method of manufacturing a semiconductor device is described herein including a capacitor that is fully integrated within the overall manufacture of FDSOI devices comprising N-channel and/or P-channel FETs. Using an FDSOI/UTBOX wafer, capacitors may be provided in a relatively simple and reliable manner in the context of below 28 nm technologies, scaling down to 10 and 7 nm very large scale integration (VLSI) CMOS techniques, for example. Particularly, in the described methods herein, the manufacturing process can make advantage of the capacitance provided by (UT)BOX layers. The combined capacitances of gate dielectrics of HKMG structures and UTBOX layers results in very high capacitances, allowing for a reduction of the overall area to be covered by capacitor structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of manufacturing a semiconductor device comprising a capacitor structure, the method comprising the steps of:

providing an SOI wafer comprising a substrate, a buried oxide (BOX) layer formed over said substrate and a semiconductor layer formed over said BOX layer;

forming an isolator structure in said wafer to define a first region of said wafer and a second region of said wafer;

removing said semiconductor layer in said first region of said wafer to expose an upper surface of said BOX layer;

removing said semiconductor layer and said BOX layer in a first portion of said second region adjacent to said isolator structure while maintaining said semiconductor layer and said BOX layer in a second portion of said second region adjacent to said first portion;

forming a dielectric layer over said exposed upper surface of said BOX layer in said first region;

forming a conductive layer over said dielectric layer; and forming a transistor device in at least one of said second portion of said second region of said wafer and a third region of said wafer that is electrically isolated from at least one of said first region and said second region, wherein a gate electrode of said transistor device comprises a part of said conductive layer and a gate dielectric of said transistor device comprises a part of said dielectric layer.

2. The method of claim 1, wherein said dielectric layer and said conductive layer are formed in said first and second region of said wafer, the method further comprising forming a mask layer over said conductive layer, patterning said mask layer to expose said conductive layer in said first portion of said second region, and removing said conductive layer and said dielectric layer in said first portion of said second region of said wafer.

3. The method of claim 1, wherein said dielectric layer and said conductive layer are formed in said first and second regions of said wafer and over said isolator structure, the method further comprising forming a mask layer over said conductive layer, patterning said mask layer to expose said conductive layer in said first portion of said second region and a part of said isolator structure adjacent to said first portion, and removing said conductive layer and said dielectric layer in said first portion of said second region of said wafer and from said exposed part of said isolator structure.

4. The method of claim 1, wherein said transistor device is a Fully Depleted SOI device.

5. The method of claim 1, wherein said dielectric layer is formed over said isolator structure and over said second region of said wafer and subsequently removed from said first portion of said second region and partially from said isolator structure.

6. The method of claim 1, wherein said conductive layer is formed over said isolator structure and over said second region of said wafer and subsequently removed from said first portion of said second region and partially from said isolator structure.

7. The method of claim 1, further comprising forming an interlayer dielectric over said first and second regions and said isolator structure, forming contact openings in said interlayer dielectric reaching to said conductive layer in said first region of said wafer and said substrate in said first portion of said second region and filling said contact openings with a contact material.

8. The method of claim 7, further comprising silicidating said conductive layer and said substrate in said first portion of said second region where said contact openings reach said silicided conductive layer and said substrate, respectively.

9. The method of claim 1, wherein a portion of said isolator structure adjacent to said first portion of said second region is removed.

10. The method of claim 1, further comprising implanting dopants in said substrate in said first region and said first portion of said second region of said wafer.

11. The method of claim 1, wherein said semiconductor layer has a thickness of less than 30 nm, said dielectric layer has a thickness of less than 20 nm and said BOX layer has a thickness of below 30 nm.

12. A method of manufacturing a semiconductor device on an SOI wafer with a substrate, a buried oxide (BOX) layer formed over said substrate and a semiconductor layer formed over said BOX layer, wherein said semiconductor device comprises a capacitor and a transistor device, the method comprising the steps of:

removing said semiconductor layer in a first region of said wafer where said capacitor is to be formed to expose said BOX layer;

forming a dielectric layer over said exposed BOX layer and in a second region of said wafer where said transistor device is to be formed; and forming a conductive layer over said dielectric layer in said first and second regions, wherein:

said conductive layer represents a capacitor electrode of said capacitor and at least part of a gate electrode of said transistor device, and said dielectric layer and said BOX layer represent a capacitor insulator of said capacitor and said dielectric layer represents at least a part of a gate dielectric of said transistor device.

13. The method of claim 12, wherein said transistor device is a Fully Depleted SOI FET.

14. The method of claim 12, further comprising forming an isolator structure in said wafer to separate said first region from said second region and removing said semiconductor layer and said BOX layer in a first portion of said second region adjacent to said isolator structure.

15. The method of claim 12, further comprising doping said substrate in said first portion of said second region and in said first region, forming an interlayer dielectric over said capacitor and electrically contacting said capacitor through said interlayer dielectric by forming a contact to said conductive layer in said first region and to said substrate in said first portion of said second region.

16. A method of manufacturing a semiconductor device comprising a capacitor structure, the method comprising the steps of:

providing an SOI wafer comprising a substrate, a buried oxide (BOX) layer formed over said substrate and a semiconductor layer formed over said BOX layer;

forming an isolator structure in said wafer to define a first region of said wafer and a second region of said wafer;

removing said semiconductor layer in said first region of said wafer to expose said BOX layer;

removing said semiconductor layer and said BOX layer in a first portion of said second region adjacent to said isolator structure while maintaining said semiconductor layer and said BOX layer in a second portion of said second region adjacent to said first portion;

forming a dielectric layer over said exposed BOX layer in said first region; and forming a conductive layer over said dielectric layer.

17. The method of claim 16, further comprising:

forming an interlayer dielectric over said first region of said wafer, said second region of said wafer, and said isolator structure;

forming first and second contact openings in said interlayer dielectric, said first contact opening exposing a portion of said conductive layer in said first region of said wafer, and said second contact opening exposing said substrate in said first portion of said second region of said wafer; and filling said first and second contact openings with a contact material.

18. The method of claim 17, further comprising implanting dopants in said substrate in said first region of said wafer and in said first portion of said second region of said wafer.

19. A method of manufacturing a semiconductor device comprising a capacitor structure, the method comprising the steps of:

providing an SOI wafer comprising a substrate, a buried oxide (BOX) layer formed over said substrate and a semiconductor layer formed over said BOX layer;

forming an isolator structure in said wafer to define a first region of said wafer and a second region of said wafer;

removing said semiconductor layer in said first region of said wafer to expose said BOX layer;

removing said semiconductor layer and said BOX layer in a first portion of said second region adjacent to said isolator structure while maintaining said semiconductor layer and said BOX layer in a second portion of said second region adjacent to said first portion;

forming a dielectric layer over said first and second regions of said wafer, said dielectric layer covering said exposed BOX layer in said first region of said wafer;

forming a conductive layer over said dielectric layer;

forming a mask layer over said conductive layer;

patterning said mask layer to expose said conductive layer in said first portion of said second region of said wafer; and removing said conductive layer and said dielectric layer in said exposed first portion of said second region of said wafer.

20. The method of claim 19, further comprising:

forming an interlayer dielectric over said first region of said wafer, said second region of said wafer, and said isolator structure;

forming first and second contact openings in said interlayer dielectric, said first contact opening exposing a portion of said conductive layer in said first region of said wafer, and said second contact opening exposing said substrate in said first portion of said second region of said wafer; and filling said first and second contact openings with a contact material.

21. The method of claim 20, further comprising implanting dopants in said substrate in said first region of said wafer and in said first portion of said second region of said wafer.

* * * * *